US012795221B2

(12) United States Patent
Okamoto et al.

(10) Patent No.: US 12,795,221 B2
(45) Date of Patent: Nov. 10, 2026

(54) IMAGE SENSOR AND IMAGE CAPTURE APPARATUS

(71) Applicant: CANON KABUSHIKI KAISHA, Tokyo (JP)

(72) Inventors: Kohei Okamoto, Kanagawa (JP); Shunichi Wakashima, Tokyo (JP); Koichi Fukuda, Tokyo (JP); Yumi Takao, Chiba (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 93 days.

(21) Appl. No.: 18/911,335

(22) Filed: Oct. 10, 2024

(65) Prior Publication Data

US 2025/0039527 A1 Jan. 30, 2025

Related U.S. Application Data

(63) Continuation of application No. PCT/JP2023/015005, filed on Apr. 13, 2023.

(30) Foreign Application Priority Data

May 11, 2022 (JP) ................................ 2022-078303

(51) Int. Cl.
*H04N 23/55* (2023.01)
*H04N 23/67* (2023.01)
(Continued)

(52) U.S. Cl.
CPC ........... *H04N 23/55* (2023.01); *H04N 23/672* (2023.01); *H04N 25/772* (2023.01); *H04N 25/79* (2023.01); *H10F 39/807* (2025.01)

(58) Field of Classification Search
CPC .... H04N 23/55; H04N 23/672; H04N 25/772; H04N 25/79; H04N 25/70; H04N 25/704; H04N 25/78; H10F 39/807; H10F 39/12
See application file for complete search history.

(56) References Cited

U.S. PATENT DOCUMENTS 11,523,078 B2 * 12/2022 Yamashita ........... H04N 25/704
2016/0079295 A1 * 3/2016 Okuzawa ............. H04N 23/672
257/432

(Continued)

FOREIGN PATENT DOCUMENTS

JP 2008193527 A 8/2008
JP 2011221253 A 11/2011

(Continued)

OTHER PUBLICATIONS

International Search Report dated Jul. 4, 2023, of International Application No. PCT/JP2023/015005, which is enclosed without an English translation.

(Continued)

*Primary Examiner* — Albert H Cutler
(74) *Attorney, Agent, or Firm* — Cowan, Liebowitz & Latman, P.C.

(57) ABSTRACT

A plurality of microlenses arranged in a matrix in first and second directions orthogonal to each other, and a plurality of photoelectric conversion portions provided for each microlens of at least some of the plurality of microlenses and configured to perform photoelectric conversion on light that has entered the photoelectric conversion portions via the each microlens are provided. The plurality of photoelectric conversion portions are arranged in at least one of the first and second directions for the plurality of photoelectric conversion portions, and in a case where influence of noise superimposed on signals read out from the plurality of photoelectric conversion units is greater in the second direction than in the first direction, the electric charge crosstalk rate between the plurality of photoelectric conversion units in the first direction is made higher than the electric charge crosstalk rate in the second direction.

11 Claims, 12 Drawing Sheets

(51) Int. Cl.
*H04N 25/772* (2023.01)
*H04N 25/79* (2023.01)
*H10F 39/00* (2025.01)

(56) References Cited

U.S. PATENT DOCUMENTS

| | | | | |
|---|---|---|---|---|
| 2017/0104020 | A1 | 4/2017 | Lee | |
| 2017/0263664 | A1* | 9/2017 | Koizumi | H10F 39/182 |
| 2019/0131328 | A1 | 5/2019 | Kim | |
| 2020/0176490 | A1* | 6/2020 | Ikeda | H10F 39/8063 |
| 2020/0235149 | A1* | 7/2020 | Shiraishi | H10F 39/12 |
| 2020/0243578 | A1 | 7/2020 | Pyo | |
| 2022/0093665 | A1 | 3/2022 | Park | |
| 2024/0163587 | A1* | 5/2024 | Asahi | H04N 25/134 |
| 2024/0186357 | A1* | 6/2024 | Takahashi | H04N 25/70 |

FOREIGN PATENT DOCUMENTS

| | | | |
|---|---|---|---|
| JP | 2013041890 | A | 2/2013 |
| JP | 2013258647 | A | 12/2013 |
| JP | 2014107835 | A | 6/2014 |
| JP | 2015148676 | A | 8/2015 |
| JP | 2017162985 | A | 9/2017 |
| JP | 2017212351 | A | 11/2017 |
| JP | 2020065026 | A | 4/2020 |
| JP | 2021141552 | A | 9/2021 |
| WO | 2018078976 | A1 | 5/2018 |

OTHER PUBLICATIONS

Related U.S. Appl. No. 18/911,323, filed Oct. 10, 2024, Kohei Okamoto et al., “Image Sensor and Image Capture Apparatus”.
Related U.S. Appl. No. 18/911,385, filed Oct. 10, 2024, Kohei Okamoto et al., “Image Sensor and Image Capture Apparatus”.

* cited by examiner

IMAGE SENSOR AND IMAGE CAPTURE APPARATUS

CROSS-REFERENCE TO RELATED APPLICATIONS

This application is a Continuation of International Patent Application No. PCT/JP2023/015005, filed Apr. 13, 2023, which claims the benefit of Japanese Patent Application No. 2022-078303, filed May 11, 2022, both of which are hereby incorporated by reference herein in their entirety.

BACKGROUND OF THE INVENTION

Field of the Invention

The present invention relates to an image sensor in which pixel portions that each include a plurality of photoelectric conversion portions are arranged two-dimensionally, and an image capture apparatus that has the image sensor mounted therein.

Background Art

Conventionally, so-called on-imaging plane phase difference method for obtaining a pair of pupil-division signals using each focus detection pixel formed in an image sensor and performing phase-difference focus detection is known as a focus detection method that is performed by an image capture apparatus.

As an example of such an on-imaging plane phase difference method, Patent Literature 1 discloses an image capture apparatus that uses a two-dimensional image sensor in which one microlens and a plurality of divided photoelectric conversion portions are formed in each pixel. The plurality of photoelectric conversion portions are configured to receive light transmitted through different areas of the exit pupil of an image capturing lens via the one microlens to realize, thereby pupil-division is realized. Phase difference focus detection can then be performed by calculating an image shift amount based on phase difference signals that are signals of the individual photoelectric conversion portions. In addition, ordinary image signals can be obtained by adding the signals of the individual photoelectric conversion portions together for each pixel. In addition, Patent Literature 1 discloses a configuration in which the saturation tolerance of pixels is increased by arranging a plurality of types of pixels in which the heights of separation barriers between photoelectric conversion portions differ.

In such an image sensor, with a configuration in which, in each pixel, a plurality of photoelectric conversion portions are arranged in a horizontal direction and the pupil-division direction is the horizontal direction, for example, when a subject has a horizontal stripe texture or the like, there have been cases where parallax is unlikely to appear, and the focus detection accuracy decreases.

In contrast, Patent Literature 2 discloses a technique for improving the focus detection accuracy by arranging photoelectric conversion portions with respect to each microlens in two directions, thereby performing pupil division in two directions. In addition, Patent Literature 2 discloses a configuration in which intensity by which an electric charge is leaked to an adjacent photoelectric conversion portion is different between a structure in which photoelectric conversion portions adjacent in the vertical direction are separated from each other and a structure in which photoelectric conversion portions adjacent in the horizontal direction are separated from each other. Due to this configuration, an oversaturated electric charge received when the electric charge amount that can be accumulated in one photoelectric conversion portion is exceeded is leaked to and accumulated in another photoelectric conversion portion disposed in a predetermined direction, and, as a result, even when one photoelectric conversion portion is saturated, it is possible to perform phase-difference focus detection in the horizontal direction or the vertical direction.

In Japanese Patent Laid-Open No. 2014-107835, the pupil division directions are two, the row direction and the column direction. Here, for example, if the number of pupil-divided pixels divided in the row direction differs from the number of pupil-divided pixels divided in the column direction, the S/N ratio (signal-to-noise ratio) of the phase difference signal in the row direction and the phase difference signal in the column direction differs. Therefore, the focus detection performance of the phase difference method may differ between the row direction and the column direction.

However, since Japanese Patent Laid-Open No. 2014-107835 does not disclose anything about the case where the S/N ratio differs between the row direction and the column direction, it is unable to solve the above problem.

CITATION LIST

Patent Literature

PTL1: Japanese Patent Laid-Open No. 2017-212351
PTL2: Japanese Patent Laid-Open No. 2014-107835

SUMMARY OF THE INVENTION

The present invention has been made in consideration of the above situation, and has as its object to bring the focus detection performance in the row direction and the column direction closer to each other in a case where the S/N ratio of the focus detection signal obtained from an image sensor in which pixels are arranged in a matrix differs between the row direction and the column direction.

According to the present invention, provided is an image sensor comprising: a plurality of microlenses arranged in a matrix in a first direction and a second direction orthogonal to the first direction; and a plurality of photoelectric conversion portions provided for each microlens of at least some of the plurality of microlenses and configured to perform photoelectric conversion on light that has entered the photoelectric conversion portions via the each microlens, wherein the plurality of photoelectric conversion portions are arranged in at least one direction of the first direction and the second direction for the plurality of photoelectric conversion portions, and wherein, in a case where influence of noise superimposed on signals read out from the plurality of photoelectric conversion units is greater in the second direction than in the first direction, the electric charge crosstalk rate between the plurality of photoelectric conversion units in the first direction is made higher than the electric charge crosstalk rate in the second direction.

Further, according to the present invention, provided is an image sensor comprising: a plurality of microlenses arranged in a matrix in a first direction and a second direction orthogonal to the first direction; and a plurality of photoelectric conversion portions provided for each microlens of at least some of the plurality of microlenses and configured to perform photoelectric conversion on light that has entered the photoelectric conversion portions via the each microlens, wherein the plurality of photoelectric conversion portions are arranged in at least one direction of the first direction and the second direction for the plurality of photoelectric conversion portions, and wherein a number of the plurality of photoelectric conversion portions arranged in the first direction is larger than a number of the plurality of photoelectric conversion portions arranged in the second direction, and the electric charge crosstalk rate between the plurality of photoelectric conversion units in the first direction is made higher than the electric charge crosstalk rate in the second direction.

Furthermore, according to the present invention, provided is an image sensor comprising: a plurality of microlenses arranged in a matrix in a first direction and a second direction orthogonal to the first direction; a plurality of photoelectric conversion portions provided for each microlens of at least some of the plurality of microlenses and configured to perform photoelectric conversion on light that has entered the photoelectric conversion portions via the each microlens; a plurality of floating diffusion portions provided for the plurality of photoelectric conversion sections, respectively; and a charge-to-voltage conversion portion that converts charge transferred from the plurality of photoelectric conversion portions to the floating diffusion portions into voltages, wherein the plurality of photoelectric conversion portions are arranged in at least one direction of the first direction and the second direction for the plurality of photoelectric conversion portions, and wherein lengths of wirings from diffusion layers constituting the floating diffusion portions corresponding to the plurality of photoelectric conversion portions arranged in the first direction to the charge-to-voltage conversion portion is shorter than lengths of wirings from diffusion layers constituting the floating diffusion portions corresponding to the plurality of photoelectric conversion portions arranged in the second direction to the charge-to-voltage conversion portion, and the electric charge crosstalk rate between the plurality of photoelectric conversion units in the first direction is made higher than the electric charge crosstalk rate in the second direction.

Further, according to the present invention, provided is an image capture apparatus characterized by comprising: an image sensor comprising: a plurality of microlenses arranged in a matrix in a first direction and a second direction orthogonal to the first direction; and a plurality of photoelectric conversion portions provided for each microlens of at least some of the plurality of microlenses and configured to perform photoelectric conversion on light that has entered the photoelectric conversion portions via the each microlens, and a processing unit that processes signals output from the image sensor, wherein the plurality of photoelectric conversion portions are arranged in at least one direction of the first direction and the second direction for the plurality of photoelectric conversion portions, wherein, in a case where influence of noise superimposed on signals read out from the plurality of photoelectric conversion units is greater in the second direction than in the first direction, the electric charge crosstalk rate between the plurality of photoelectric conversion units in the first direction is made higher than the electric charge crosstalk rate in the second direction, and wherein the processing unit is implemented by one or more processors, circuitry or a combination thereof.

Further features of the present invention will become apparent from the following description of exemplary embodiments with reference to the attached drawings.

DESCRIPTION OF THE EMBODIMENTS

Figure 1:
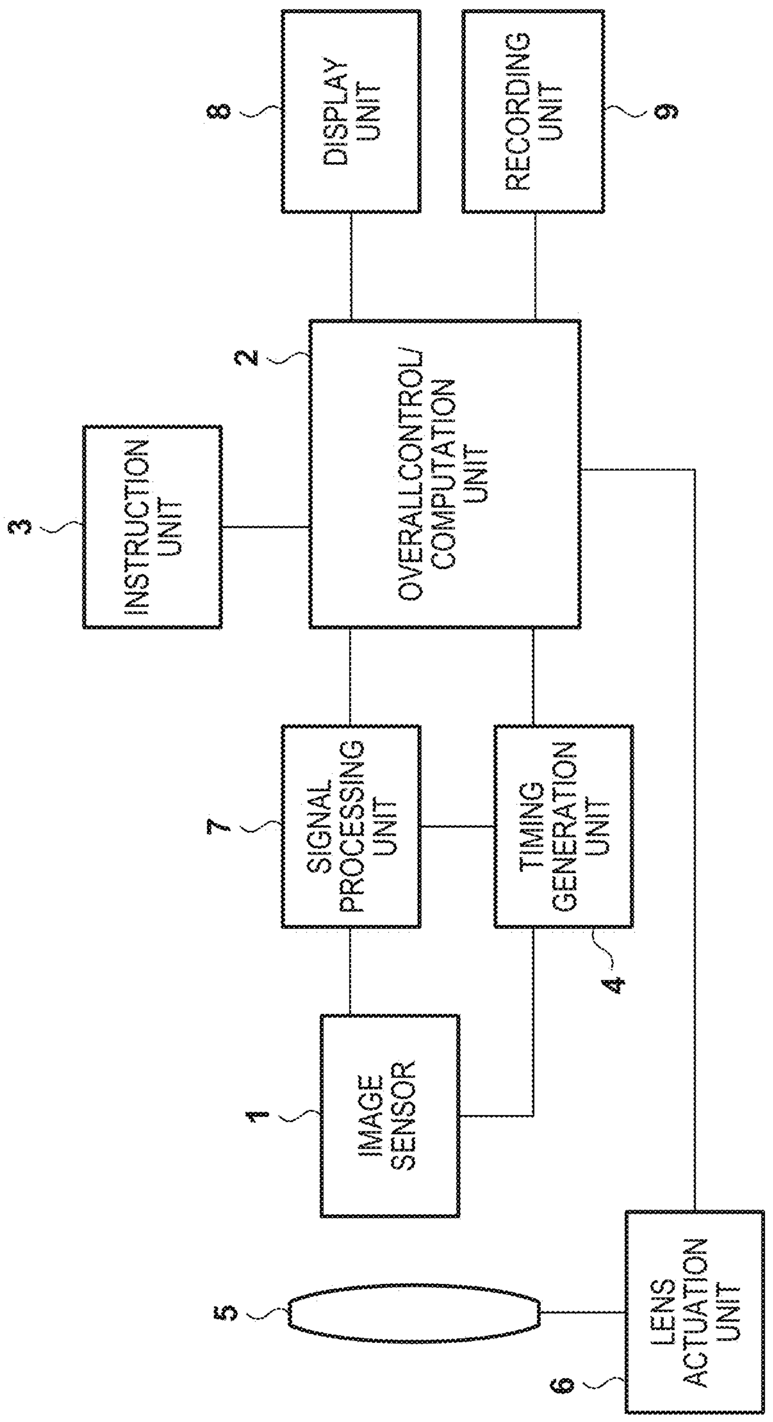
FIG. 1 is a block diagram showing a schematic configuration of an image capture apparatus according to a first embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

First Embodiment

Overall Configuration

FIG. 1 is a block diagram showing a schematic configuration of an image capture apparatus according to a first embodiment of the present invention. The image capture apparatus according to the present embodiment includes an image sensor 1, an overall control/computation unit 2, an instruction unit 3, a timing generation unit 4, an imaging lens unit 5, a lens actuation unit 6, a signal processing unit 7, a display unit 8, and a recording unit 9.

The imaging lens unit 5 is used to form an optical image of a subject by the image sensor 1. The imaging lens unit 5, which is illustrated as one lens in the figure, includes a plurality of lenses that include a focus lens, a zoom lens, and the like, and a diaphragm. In addition, the imaging lens unit 5 may be detachable from the main body of the image capture apparatus, or may also be formed in integrally with the main body.

The image sensor 1 converts light that has entered the image sensor 1 via the imaging lens unit 5 into electrical signals, and outputs the electrical signals. Signals are read out from the pixels of the image sensor 1 such that it is possible to obtain pupil divided signals (hereinafter, referred to as "phase difference signals") that have been obtained through pupil division and can be used for phase-difference focus detection, and image signals corresponding to the pixels.

The signal processing unit 7 performs predetermined signal processing such as correction processing on signals output from the image sensor 1, and outputs phase difference signals to be used for focus detection and image signals to be used for recording.

The overall control/computation unit 2 performs overall actuation and control of the entire image capture apparatus. In addition, the overall control/computation unit 2 performs computation for focus detection using phase difference signals processed by the signal processing unit 7, and performs, on image signals, predetermined signal processing such as computation processing for exposure control, development for generating an image to be recorded/reproduced, and compression.

The lens actuation unit 6 is a unit for actuating the imaging lens unit 5, and performs focus control, zoom control, aperture control, and the like on the imaging lens unit 5 in accordance with a control signal from the overall control/computation unit 2.

The instruction unit 3 accepts input of an instruction to execute image capturing, actuation mode settings of the image capture apparatus, other various types of settings, selection, and the like, which are input from outside through an operation performed by a user or the like, and transmits such input to the overall control/computation unit 2.

The timing generation unit 4 generates a timing signal for actuating the image sensor 1 and the signal processing unit 7 in accordance with a control signal from the overall control/computation unit 2.

The display unit 8 displays a preview image, a reproduced image, and information such as actuation mode settings of the image capture apparatus. The recording unit 9 is provided with a recording medium (not illustrated), and image signals for recording are recorded. Examples of the recording medium include a semiconductor memory such as a flash memory. The recording medium may be detachable from or incorporated in the recording unit 9.

Image Sensor

Figure 2:
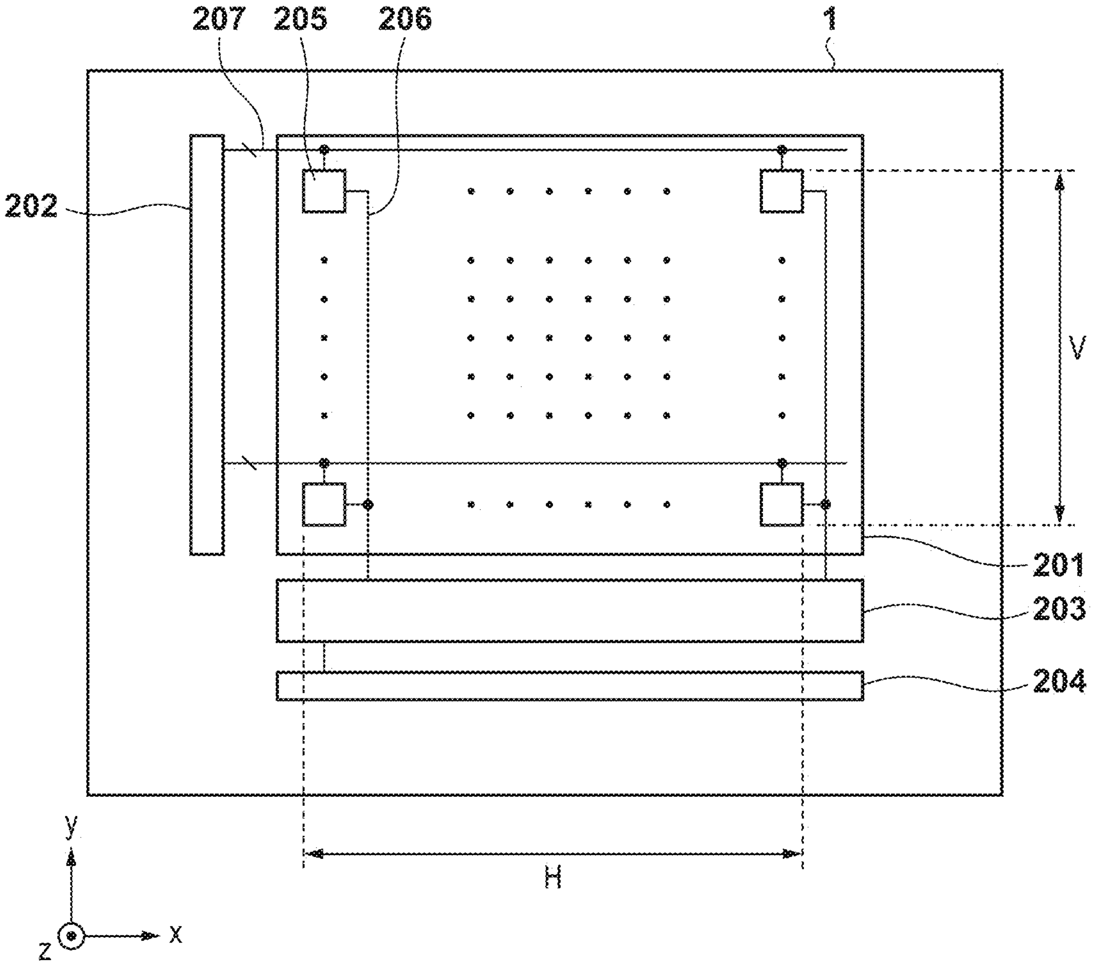
FIG. 2 is a diagram schematically showing an example of an overall configuration of an image sensor according to the first embodiment.

FIG. 2 is a diagram schematically showing an example of an overall configuration of the image sensor 1 shown in FIG. 1. The image sensor 1 includes a pixel array unit 201, a vertical selection circuit 202, a column circuit 203, and a horizontal selection circuit 204.

In the pixel array unit 201, a plurality of pixels 205 are arranged in a matrix. As a result of output of the vertical selection circuit 202 being input to pixels 205 via a pixel actuation wiring group 207, pixel signals of the pixels 205 in a row selected by the vertical selection circuit 202 are read out to the column circuit 203 via output signal lines 206 in units of rows. One output signal line 206 can be provided for each pixel column or a plurality of pixel columns, or a plurality of output signal lines 206 can be provided for each pixel column. Signals read out in parallel are input to the column circuit 203 via a plurality of output signal lines 206, and the column circuit 203 performs processing such as amplification, noise reduction, and A/D conversion on the signals, and holds the processed signals. The horizontal selection circuit 204 sequentially, randomly, or simultaneously selects signals held in the column circuit 203, and, as a result, the selected signals are output to the outside of the image sensor 1 via a horizontal output line and an output unit (not illustrated).

By sequentially performing an operation of outputting pixel signals of a row selected by the vertical selection circuit 202 to the outside of the image sensor 1 in this manner while changing a row selected by the vertical selection circuit 202, it is possible to read out two-dimensional image signals or phase difference signals from the image sensor 1.

Pixel Circuit/Signal Readout

Figure 3:
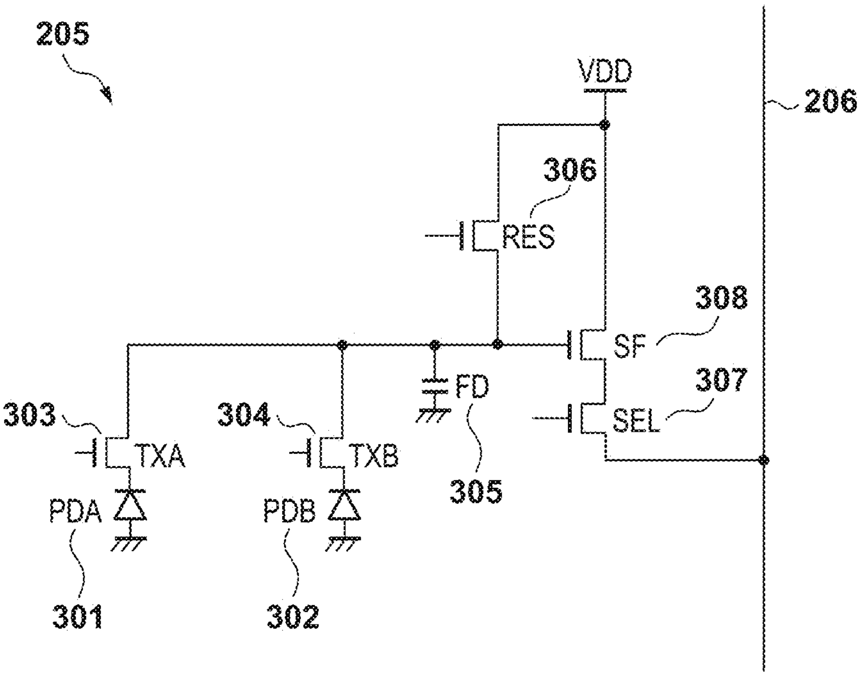
FIG. 3 is an equivalent circuit diagram of a pixel according to the first embodiment.

FIG. 3 is a diagram of an equivalent circuit of a pixel 205 according to the present embodiment.

Each pixel 205 includes two photo diodes 301 (PDA) and 302 (PDB) that are photoelectric conversion portions. A signal charge obtained through photoelectric conversion by the PDA 301 in accordance with an incident light amount and accumulated is transferred to a floating diffusion portion (FD) 305 that constitutes an electric charge accumulation portion, via a transfer switch (TXA) 303. In addition, a charge signal that has been subjected to photoelectric conversion by the PDB 302, and has accumulated is transferred to the FD 305 via a transfer switch (TXB) 304. By a reset switch (RES) 306 being switched on, the FD 305 is reset to the voltage of a constant voltage source VDD. In addition, by the RES 306, the TXA 303, and the TXB 304 being switched on at the same time, the PDA 301 and the PDB 302 can be reset.

By a select switch (SEL) 307 for selecting pixels being switched on, an amplification transistor (SF) 308 (charge-to-voltage conversion unit) converts a signal charge accumulated in the FD 305 into a voltage, and the signal voltage obtained through conversion is output from the pixel to the output signal line 206. In addition, the gates of the TXA 303, the TXB 304, the RES 306, and the SEL 307 are connected to the pixel actuation wiring group 207, and are controlled by the vertical selection circuit 202.

Note that, in the following description, in the present embodiment, a signal charge that accumulates in a photoelectric conversion portion is defined as an electron, the photoelectric conversion portions are formed by an N-type semiconductor, and is separated by a P-type semiconductor, but a configuration may also be adopted in which a signal charge is defined as an electron hole, and the photoelectric conversion portions are formed by a P-type semiconductor, and is separated by an N-type semiconductor.

Next, an operation of reading out signal charges from the PDA 301 and the PDB 302 in a pixel having the above configuration after a predetermined electric charge accumulation time has elapsed from when the PDA 301 and the PDB 302 were reset will be described. First, when the SEL 307 of each pixel in a row selected by the vertical selection circuit 202 is switched on, and the source of the SF 308 and the output signal line 206 are connected to each other, the output signal line 206 enters an state where a voltage corresponding to the voltage of the FD 305 is read out. Next, the RES 306 is switched on/off, the potential of the FD 305 is reset. A waiting period is provided after that until the output signal line 206 that has undergone a voltage change in the FD 305 is stabilized, and the voltage of the stabilized output signal line 206 is taken in as a signal voltage N by the column circuit 203, is subjected to signal processing, and is held.

The TXA 303 is then switched on/off, and a signal charge accumulated in the PDA 301 is transferred to the FD 305. The voltage of the FD 305 decreases by an amount corresponding to the amount of the signal charge accumulated in the PDA 301. A waiting period is provided after that until the output signal line 206 that has undergone a voltage change in the FD 305 is stabilized, and the voltage of the stabilized output signal line 206 is taken in as a signal voltage A by the column circuit 203, is subjected to signal processing, and is held.

The TXB 304 is then switched on/off, and a signal charge accumulated in the PDB 302 is transferred to the FD 305. The voltage of the FD 305 decreases by an amount corresponding to the amount of the signal charge accumulated in the PDB 302. A waiting period is provided after that until the output signal line 206 that has undergone a voltage change in the FD 305 is stabilized, and the voltage of the stabilized output signal line 206 is taken in as a signal voltage (A+B) by the column circuit 203, is subjected to signal processing, and is held.

A signal A that is based on the amount of the signal charge accumulated in the PDA 301 can be obtained based on the difference between the signal voltage N and the signal voltage A taken in in this manner. In addition, a signal B that is based on the amount of the signal charge accumulated in the PDB 302 can be obtained based on the difference between the signal voltage A and the signal voltage (A+B). This difference calculation may be performed by the column circuit 203, or may be performed after signals are output from the image sensor 1. Phase difference signals can be obtained by using the signal A and the signal B, and an image signal can be obtained by adding the signal A and the signal B together. Alternatively, when difference calculation is performed after signals are output from the image sensor 1, an image signal may be obtained by using the difference between the signal voltage N and the signal voltage (A+B).

In addition, the signal voltage N, the signal voltage A, and the signal voltage B may be read out by performing the readout operation for the PDB 302 similarly to that performed for the PDA 301 for reading out the signal voltage N and the signal voltage A. In that case, the signal A and the signal B respectively obtained from the signal voltage A and the signal voltage B can be used as phase difference signals as is, and an image signal can be obtained by adding the signal voltage A and the signal voltage B together, or adding the signal A and the signal B together.

Configuration of Photoelectric Conversion Area

Phase Difference Detection Pixel Structure in x Direction

Figure 4A:
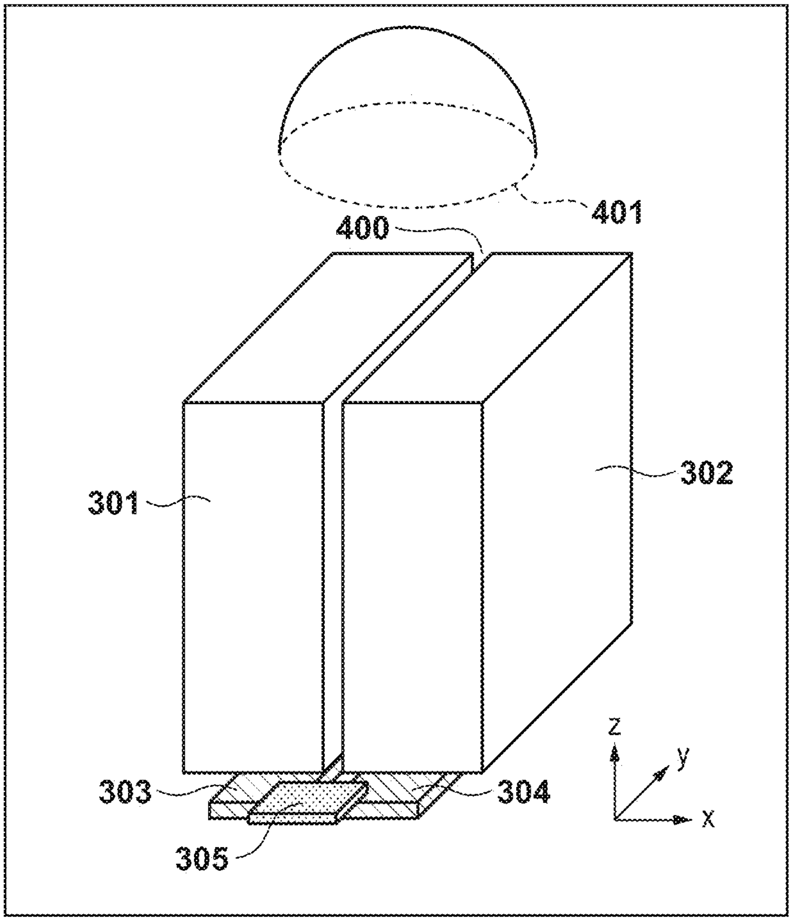
FIG. 4A is a schematic diagram showing a configuration of a pixel having first arrangement according to the first embodiment.
Figure 4B:
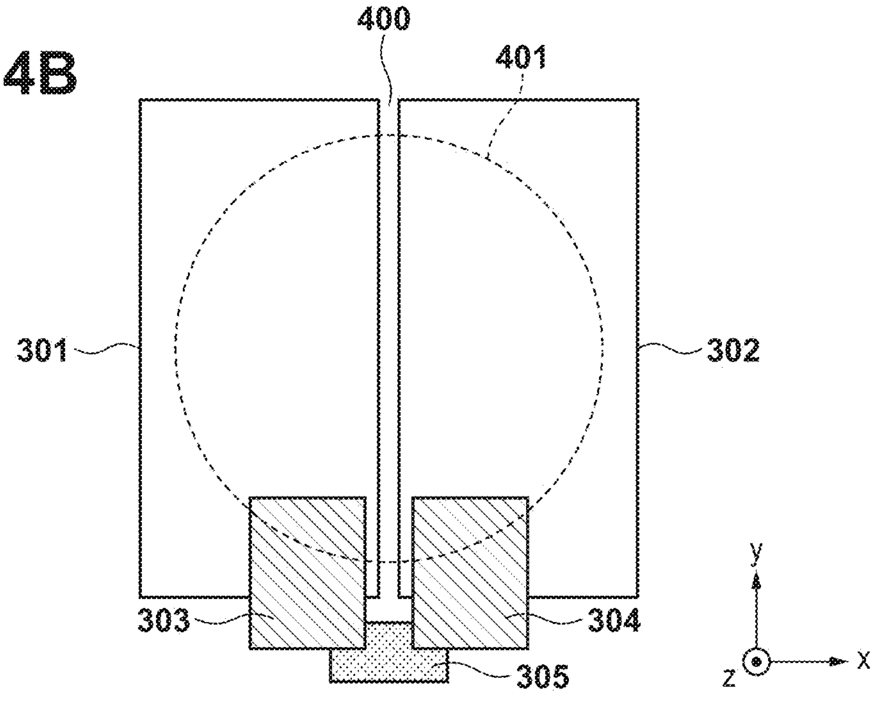
FIG. 4B is a schematic diagram showing the configuration of the pixel having the first arrangement according to the first embodiment.

FIGS. 4A and 4B are schematic diagrams showing first arrangement of a semiconductor area that constitutes the pixel 205 according to the present embodiment, FIG. 4A is a schematic perspective diagram, and FIG. 4B is a schematic plane diagram showing the positional relation in planar view. Note that "planar view" refers to viewing a plane (xy plane) parallel to a plane on a side on which the gate of the transistor of the semiconductor substrate is disposed, from the z direction or the −z direction. In addition, a "row" direction refers to the x direction, a "column" direction refers to the y direction, and a "depth" direction refers to the z direction.

As shown in FIG. 4A, the pixel 205 having the first arrangement includes a microlens (ML) 401, the PDA 301, the PDB 302, the TXA 303, the TXB 304, and the FD 305. In the first arrangement, the PDA 301 and the PDB 302 are arranged in the x direction, and are formed within an Si substrate that is a semiconductor substrate, a side of the substrate on which the ML 401 is disposed is the back side, and a side of the substrate on which the TXA 303 and TXB 304, and the FD 305 are disposed is the front side.

Most of light that has entered the pixel via the ML 401 is subjected to photoelectric conversion on the substrate back side on which the PDA 301 and the PDB 302 are disposed. Here, a potential gradient is formed such that a potential that is imposed on electrons decreases in the depth direction in the PDA 301 and the PDB 302 to make electric charges that have been generated in the PDA 301 and the PDB 302 be likely to move to the TXA 303 and the TXB 304, respectively.

In addition, a separation area 400 in which the p-type impurity concentration is higher than those of the PDA 301 and the PDB 302 is formed such that a potential barrier is formed between the PDA 301 and the PDB 302. Accordingly, the PDA 301 and the PDB 302 are electrically separated from each other such that an electric charge that has been generated is unlikely to move therebetween. Therefore, in the present embodiment, the division direction of the PDA 301 and the PDB 302 in the first arrangement is the x direction (a first direction).

Phase Difference Detection Pixel Structure in y Direction

Figure 5A:
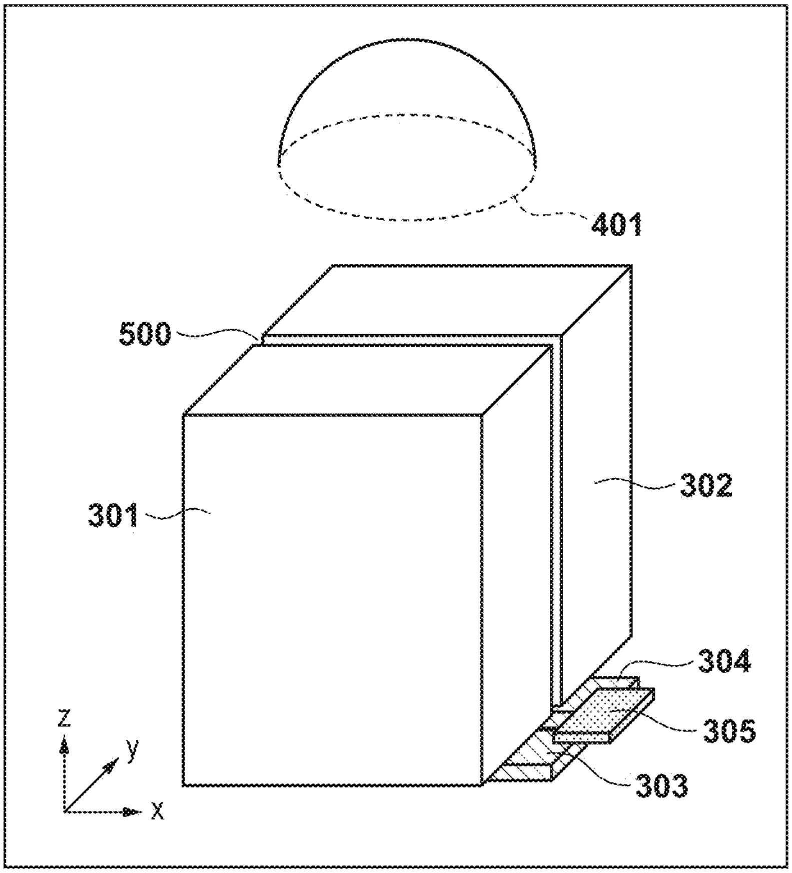
FIG. 5A is a schematic diagram showing a configuration of a pixel having second arrangement according to the first embodiment.
Figure 5B:
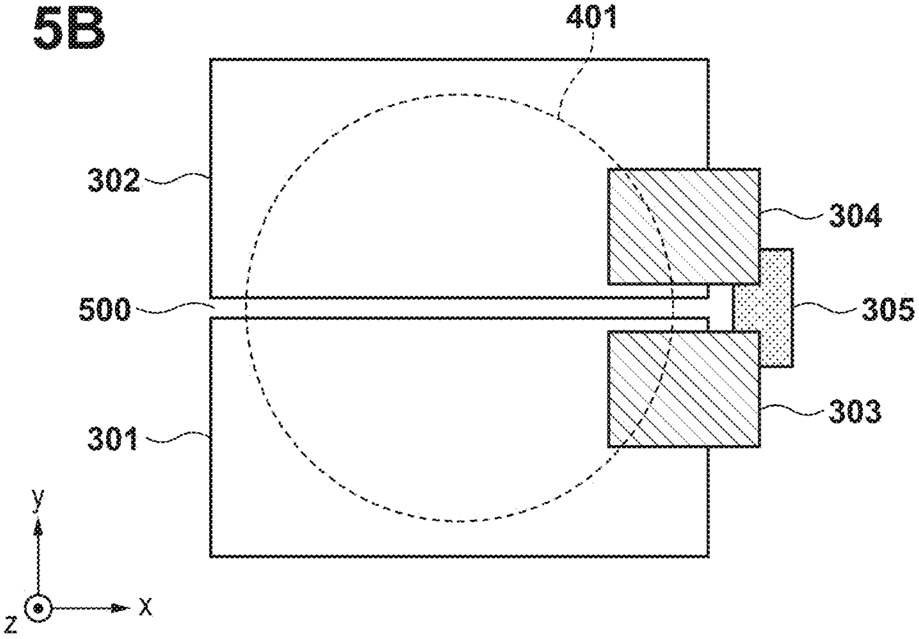
FIG. 5B is a schematic diagram showing the configuration of the pixel having the second arrangement according to the first embodiment.

FIGS. 5A and 5B are schematic diagrams showing second arrangement of a semiconductor area that constitutes a pixel 205 according to the present embodiment, FIG. 5A is a schematic perspective diagram, and FIG. 5B is a schematic plane diagram showing the positional relation in planar view. Note that definitions of "planar view" and x, y, and z are similar to those in FIGS. 4A and 4B, and thus a description thereof is omitted.

As shown in FIG. 5A, the pixel 205 having the second arrangement includes the ML 401, the PDA 301, the PDB 302, the TXA 303, the TXB 304, and the FD 305. The basic configuration of the pixel 205 having the second arrangement is similar to that of the first arrangement in FIG. 4A, but the PDA 301 and the PDB 302 are arranged in the y direction, and the separation direction of the photoelectric conversion portions is the y direction (second direction).

Also in the second arrangement, a potential gradient is formed such that a potential that is imposed on electrons decreases in the depth direction in the PDA 301 and the PDB 302 to make electric charges that have been generated in the PDA 301 and the PDB 302 be likely to move to the TXA 303 and the TXB 304, respectively. In addition, also in the second arrangement, similarly to the first arrangement, a separation area 500 in which the p-type impurity concentration is higher than those of the PDA 301 and the PDB 302 is formed between the PDA 301 and the PDB 302. Accordingly, the PDA 301 and the PDB 302 are electrically divided from each other such that an electric charge that has been generated is unlikely to move therebetween.

In this embodiment, it is assumed that color filters (not shown) are disposed between the ML 401 and the PDA 301 and PDB 302. As an example, color filters in a Bayer array are configured with R filters that mainly transmit light whose wavelength is of red, G filters that mainly transmit light whose wavelength is of green, and B filters that mainly transmit light whose wavelength is of blue. In a 2×2 pixel unit, the R filter is disposed at the upper left, the G filter at the upper right, the G filter at the lower left, and the B filter at the lower right.

Electric Charge Crosstalk Rate Distribution

Most of an electric charge generated in each of the PDA 301 and the PDB 302 is accumulated in the PDA 301 or the PDB 302, but may move from the PDA 301 to the PDB 302 or from the PDB 302 to the PDA 301, and be accumulated. Such a phenomenon of an electric charge moving from the PDA 301 to the PDB 302 or from the PDB 302 to the PDA 301 is called "electric charge crosstalk". A rate at which electric charge crosstalk occurs (hereinafter, referred to as an "electric charge crosstalk rate") is higher in an area closer to the separation areas 400 and 500 in planar view. In addition, a potential gradient is formed in the depth direction in the PDA 301 and the PDB 302 such that an electric charge is more likely to move toward the TXA 303 and the TXB 304, and thus the shorter the distance the electric charge moves to the TXA 303 or the TXB 304, the smaller the electric charge crosstalk rate becomes. That is to say, at the same x and y coordinates in the PDA 301 and the PDB 302, the electric charge crosstalk rate is lower at positions from which the distances to the TXA 303 and TXB 304 are shorter is lower than the electric charge crosstalk rate at a position closer to the ML 401. In the following description, distribution of a crosstalk rate in the PDA 301 and the PDB 302 is referred to as "electric charge crosstalk rate distribution". The steeper the potential gradient in the PDA 301 and the PDB 302 in the depth direction is, the lower the electric charge crosstalk rate distribution becomes in the PDA 301 and the PDB 302 as a whole.

In addition, electric charge crosstalk may also occur between adjacent pixels. Electric charge crosstalk that occurs between adjacent pixels is a cause of a decrease in the resolution of image capturing signals and the like. For this reason, electric charge crosstalk rate between adjacent pixels is desirably lower than the electric charge crosstalk rate from the PDA 301 to the PDB 302 or from the PDB 302 to the PDA 301. Specifically, for example, by separating adjacent pixels using an insulator or increasing the height of a potential barrier, the electric charge crosstalk rate can be suppressed low.

Method for Detecting Phase Difference in x Direction

Next, computation for calculating a defocus amount from phase difference signals by the overall control/computation unit 2 will be described.

First, phase-difference focus detection in the x direction according to the present embodiment will be described with reference to FIGS. 6 to 9. In phase-difference focus detection in the x direction according to the present embodiment, an image shift amount in the x direction is calculated from phase difference signals obtained from the pixel 205 having the first arrangement, and is converted into a defocus amount using a conversion coefficient.

Figure 6:
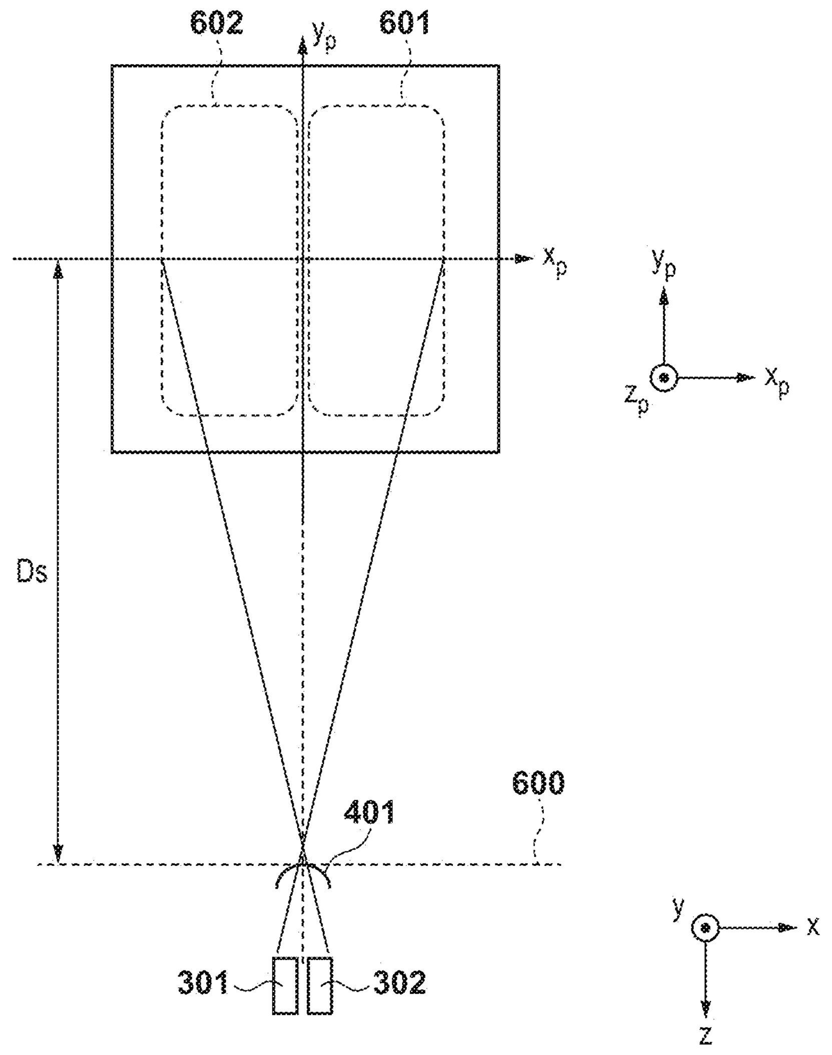
FIG. 6 is a diagram showing a relationship between the pixel having the first arrangement and a partial pupil area according to the first embodiment.

FIG. 6 shows a cross-sectional view of the pixel 205 having the first arrangement taken along the line A-A' in FIG. 4B and a pupil plane at a position distant from an image capturing plane 600 of the image sensor 1 in the −Z axis direction by a distance Ds. Note that x, y, and z denote coordinate axes on the image capturing plane 600, and $x_p$, $Y_p$, and $z_p$ denote coordinate axes on the pupil plane.

Figure 7:
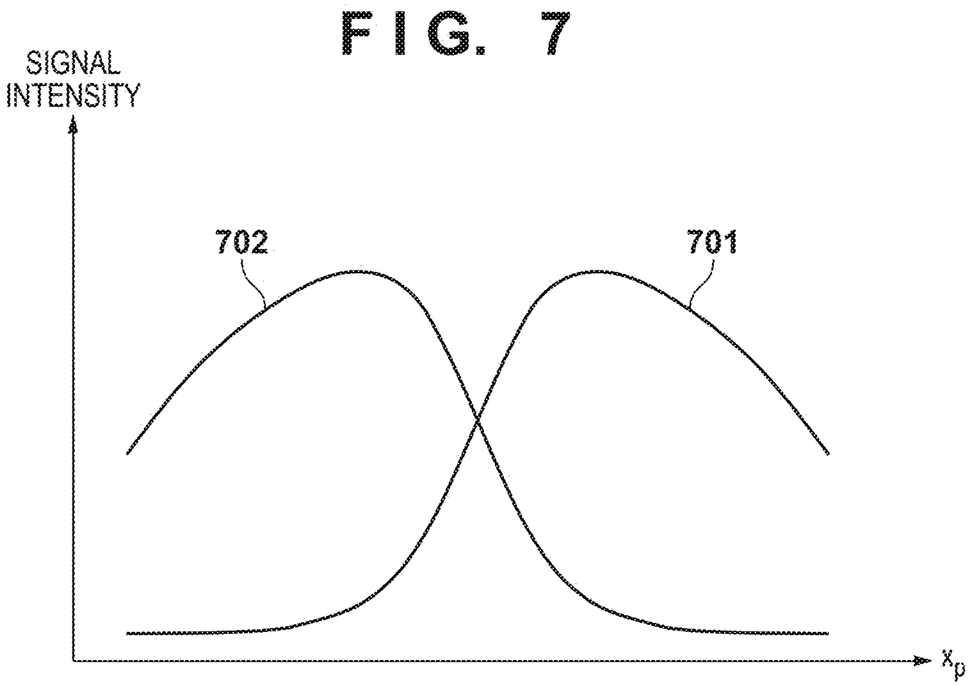
FIG. 7 is a schematic diagram showing an example of pupil intensity distribution of the pixel having the first arrangement according to the first embodiment.

The pupil plane and the light receiving surface of the image sensor 1 have substantially a conjugate relationship via the ML 401. For this reason, a light flux that has passed through the partial pupil area 601 is received by the PDA 301. In addition, a light flux that has passed through the partial pupil area 602 is received by the PDB 302. In this manner, the pupil-division direction when the pupil plane is divided in the x direction is the x direction. For this reason, division direction positional dependence of pupil intensity distributions is shaped as illustrated in FIG. 7. In FIG. 7, pupil intensity distribution corresponding to the PDA 301 is denoted by 701, and pupil intensity distribution corresponding to the PDB 302 is denoted by 702.

Figure 8:
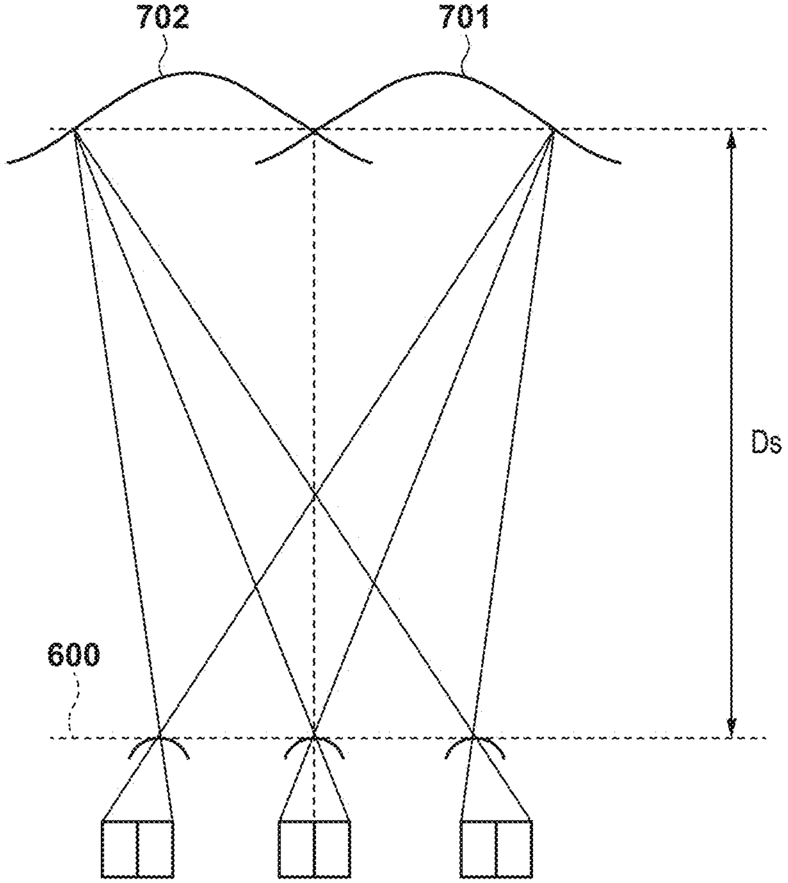
FIG. 8 is a diagram schematically describing the sensor entrance pupil of the image sensor according to the first embodiment.

Next, a sensor entrance pupil of the image sensor 1 will be described with reference to FIG. 8. In the image sensor 1 according to the present embodiment, in accordance with image height coordinates on the two-dimensional plane, the MLs 401 of the pixels 205 are continuously shifted in the central direction of the image sensor 1. That is to say, the MLs 401 are arranged eccentrically in the central direction of the image sensor 1, as the image height increases. Note that the center of the image sensor 1 and the optical axis of the image capturing optical system substantially match although they change due to a mechanism for reducing the influence of blurring caused by camera shake or the like by actuating the image capturing optical system or the image sensor 1. Accordingly, a configuration is adopted such that, on the pupil plane at a position distant from the image sensor 1 by the distance Ds (entrance pupil distance), the first pupil intensity distribution 701 and the second pupil intensity distribution 702 of pixels arranged at respective image height coordinates of the image sensor 1 generally match. That is to say, a configuration is adopted in which, on the pupil plane at a position distant from the image sensor 1 by the distance Ds, the first pupil intensity distribution 701 and the second pupil intensity distribution 702 of all of the pixels of the image sensor 1 generally match. In the present embodiment, the first pupil intensity distribution 701 and the second pupil intensity distribution 702 are referred to as "sensor entrance pupils" of the image sensor 1.

Note that there is no need to adopt a configuration in which all of the pixels have a single entrance pupil distance, and a configuration may also be adopted in which, for example, entrance pupil distances of pixels up to 80% of the image height substantially match, or pixels may be configured such that the entrance pupil distance differs for each row or for each detection area consciously.

Figure 9:
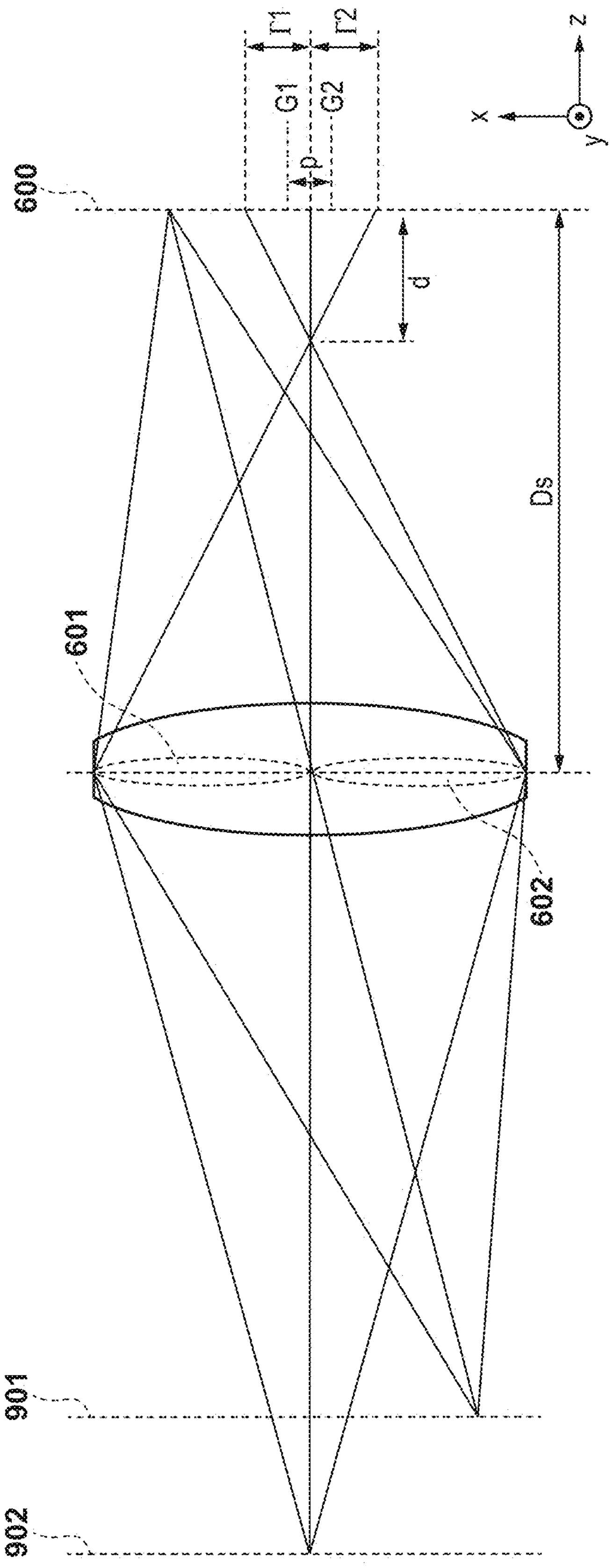
FIG. 9 is a diagram showing a schematic relationship between an image shift amount between parallax images and a defocus amount according to the first embodiment.

FIG. 9 shows a schematic diagram of a relationship between defocus amount between parallax images and image shift amount. The image sensor 1 (not illustrated) according to the present embodiment is disposed on the image capturing plane 600, and, similarly to FIG. 6, the exit pupil of the imaging lens unit 5 is divided into two, namely a partial pupil area 601 and a partial pupil area 602.

A defocus amount d is defined such that the distance from the image forming position of a subject to the image capturing plane is defined as a magnitude $|d|$, a front focus state in which the image forming position of the subject is positioned on the subject side relative to the image capturing plane is negative ($d<0$), and a rear focus state in which the image forming position of the subject is on the opposite side to the subject relative to the image capturing plane is positive ($d>0$). An in-focus state in which the image forming position of the subject is on the image capturing plane is defined as $d=0$. FIG. 9 shows examples in which a subject on an object plane 901 is in the in-focus state ($d=0$), and the subject on an object plane 902 is in the front focus state ($d<0$). The front focus state ($d<0$) and the rear focus state ($d>0$) are collectively defined as a defocus state ($|d|>0$).

In the front focus state ($d<0$), a light flux that has passed through the partial pupil area 601 (602), out of a light flux from the subject on the object plane 902, is collected once, and then spreads centered on a centroid position G1 (G2) of the light flux along a width Γ1 (Γ2), and forms a blurred image on the image capturing plane 600. The blurred image is received by the PDA 301 and the PDB 302, and parallax images are generated. Thus, in the generated parallax images, at the centroid position G1 (G2), an image of the subject on the object plane 902 is blurred with the width Γ1 (Γ2).

The blurring width Γ1 (Γ2) of the subject image increases generally on a proportional basis as the magnitude |d| of the defocus amount d increases. Similarly, the magnitude |p| of an image shift amount p (=G2−G1) of the subject image between the parallax images also increases generally on a proportional basis as the magnitude |d| of the defocus amount d increases. This applies to the rear focus state (d>0) although the image shift direction of the subject image between parallax images is opposite to that of the front focus state. In the in-focus state (d=0), the centroid position of subject image between parallax images match (p=0), and image shift does not occur.

Therefore, regarding two phase difference signals obtained using signals of the PDA 301 and the PDB 302, the magnitude of the image shift amount between the two phase difference signals in the x direction increases as the magnitude of the defocus amount of the parallax images increases. Based on this relationship, by converting, into a defocus amount, an image shift amount calculated through correlation calculation while shifting the parallax images in the x direction, phase-difference focus detection is performed.

Phase-Difference Detection Method in y Direction

As a phase-difference detection method in the y direction (second direction) according to the present embodiment, it is possible to use a method similar to the above-described phase-difference detection method in the x direction (first direction) in which signals from the pixels 205 having the first arrangement are used. That is to say, phase-difference detection in the y direction (second direction) is performed using signals from the pixels 205 having the second arrangement in place of the pixels 205 having the first arrangement.

Conversion Coefficient

A coefficient that is multiplied when an image shift amount is converted into a defocus amount is referred to as a conversion coefficient. This conversion coefficient is roughly inversely proportional to the distance between the centers of gravity of the pupil intensity distribution 701 and the pupil intensity distribution 702. If the conversion coefficient is large, a larger defocus amount is calculated from a smaller image shift amount compared with a case where the conversion coefficient is small, and thus the calculation is likely to be affected by the noise of the phase difference signals, and there is the possibility that the phase-difference detection performance will decrease. That is, the longer the distance between the centers of gravity of the pupil intensity distribution 701 and the pupil intensity distribution 702, the more the influence of noise on the phase difference signal is reduced.

Figure 10:
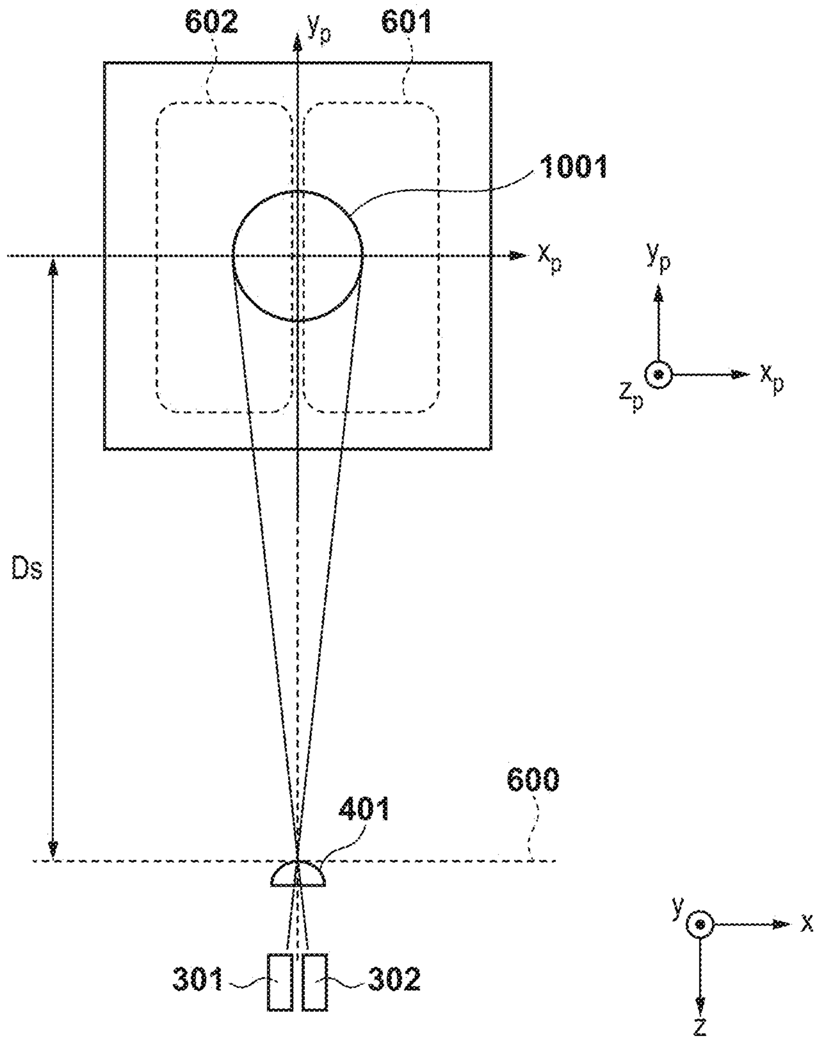
FIG. 10 is a diagram illustrating a relationship between a pixel, an exit pupil, and partial pupil regions according to the first embodiment.

Here, a conversion coefficient in a case where the pupil region of the imaging lens unit 5 is limited by the diaphragm will be described with reference to FIGS. 10 and 11. FIG. 10 is a schematic diagram in which an exit pupil 1001 narrowed down by the diaphragm is superimposed on the partial pupil areas 601, 602 and the A-A' cross-sectional view of the pixel 205 having the first arrangement shown in FIG. 6, and the exit pupil 1001 is divided by the partial pupil areas 601 and 602.

Figure 11:
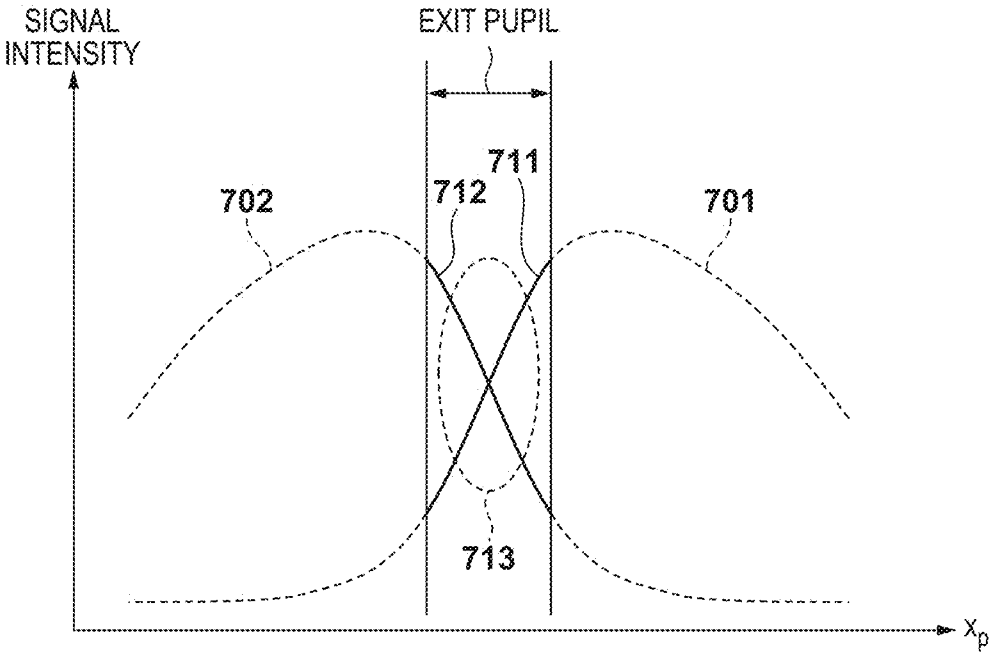
FIG. 11 is a diagram schematically illustrating a relationship between an exit pupil and pupil intensity distribution according to the first embodiment.

FIG. 11 shows a first partial pupil intensity distribution 711 and a second partial pupil intensity distribution 712 of a received light flux corresponding to the exit pupil 1001, out of the first pupil intensity distribution 701 and the second pupil intensity distribution 702 in a case where the pupil is not stopped down by the aperture in the above a case. In this case, since the conversion coefficient is determined according to the distance between the centers of gravity of the first partial pupil intensity distribution 711 and the second partial pupil intensity distribution 712, the greater the slope of the graph in a region 713 where the pupil intensity distributions intersect, the longer the distance between the centers of gravity and the smaller the conversion coefficient. In other words, the greater the slope in the region where the pupil intensity distributions limited by the exit pupil 1001 intersect, the smaller the conversion coefficient, and therefore the smaller the influence of noise on the phase difference signals.

Electric Charge Crosstalk Rate

Relationship between Electric Charge Crosstalk Rate Distribution and Conversion Coefficient.

Figure 12:
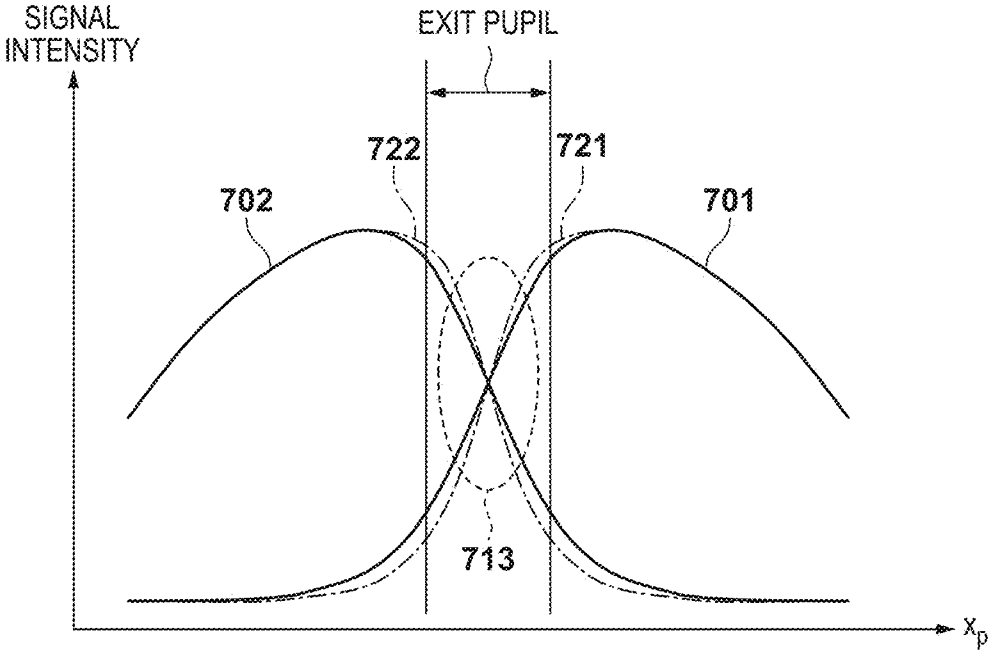
FIG. 12 is a diagram illustrating a relationship between a charge crosstalk rate distribution and a pupil intensity distribution according to the first embodiment.

Next, the relationship between the magnitude of the electric charge crosstalk rate and the pupil intensity distribution will be described with reference to FIG. 12. Electric charge crosstalk is a phenomenon in which electric charge generated in the PDA 301 moves to the PDB 302, or electric charge generated in the PDB 302 moves to the PDA 301 and is accumulated there. That is, when the electric charge crosstalk rate is small, the mixing of the signals of the PDA 301 and the PDB 302 is small compared to when the electric charge crosstalk rate is large. FIG. 12 is a diagram comparing the first pupil intensity distribution 701 and the second pupil intensity distribution 702 when the electric charge crosstalk rate is large with a first pupil intensity distribution 721 and a second pupil intensity distribution 722 (dot-dash line) when the electric charge crosstalk rate distribution is small. When the electric charge crosstalk rate is small, the slope of the graph in the region 713 where the pupil intensity distributions intersect becomes large.

Therefore, the slope in the region where the pupil intensity distributions limited by exit pupil 1001 intersect is greater for the first pupil intensity distribution 721 and the second pupil intensity distribution 722, which have a small electric charge crosstalk rate, than for the first pupil intensity distribution 701 and the second pupil intensity distribution 702, which have a large electric charge crosstalk rate. In other words, the smaller the electric charge crosstalk rate, the smaller the conversion coefficient and the smaller the influence of noise on the phase difference signals.

Noise on Phase Difference Signals

Noise on the phase difference signals includes optical shot noise, which is the fluctuation of light itself, and readout circuit noise, which is superimposed on the signal in the SF 308 and the column circuit 203. In a region where the charge generated by photoelectric conversion is sufficiently large, the optical shot noise is generally the square root of the number of signal charges. Furthermore, the readout circuit noise is generally a constant value regardless of the amount of signal charge. Therefore, the more charges generated by photoelectric conversion, the higher the S/N ratio and the smaller the noise in the phase difference signals.

Figure 13:
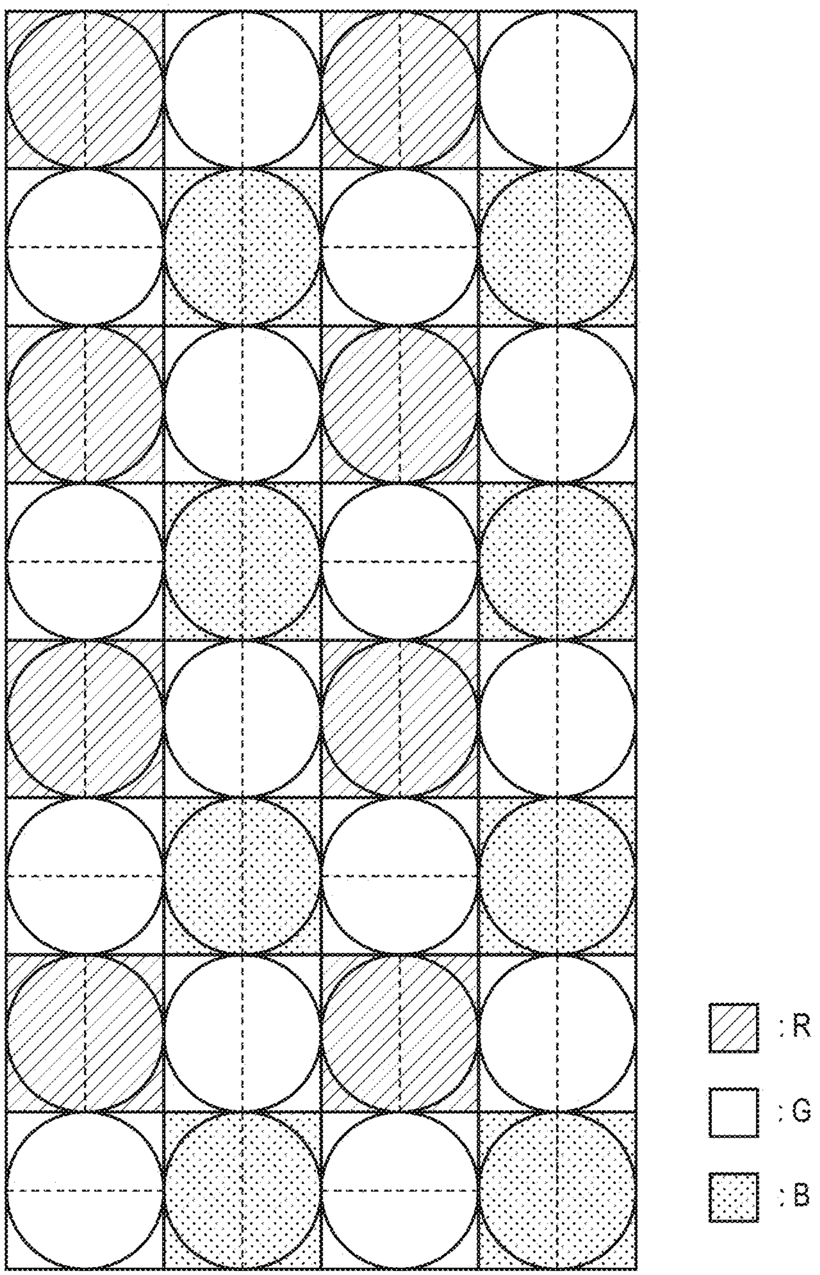
FIG. 13 is a diagram illustrating an example of pixel arrangement according to the first embodiment.

FIG. 13 is a diagram showing an example of an arrangement of the pixels 205 having the first arrangement and the pixels 205 having the second arrangement in 8 rows and 4 columns in the pixel array unit 201 of this embodiment. Here, the description will be given of based on a 2×2 pixel unit consisting of an R pixel covered with an R filter, two G pixels covered with a G filter, and a B pixel covered with a B filter that constitute a Bayer arrangement. Of the 2×2 pixel unit, the R pixel, one of the G pixels, and the B pixel are the pixels 205 having the first arrangement that divides the pupil in the x direction, and the remaining G pixel is the pixel 205 having the second arrangement that divides the pupil in the y direction.

As will be apparent from FIG. 13, the number of pixels 205 having the first arrangement in one row is greater than the number of pixels 205 having the second arrangement in one column, so the phase difference signal in the x direction is a signal based on more light than the phase difference signal in the y direction, and therefore the S/N ratio of the phase difference signal in the x direction is higher than that of the phase difference signal in the y direction.

Further, in the structure shown in FIG. 3, the closer the distance between the diffusion layer constituting the FD 305 and the SF 308, the shorter the wiring connecting them (hereinafter referred to as "FD wiring") and the smaller the capacitance of the FD 305. If the capacitance of the FD 305 is small, the charge-voltage conversion gain is large, and the influence of suppressing noise superimposed in the subsequent stage is large, resulting in low noise. Here, if it is difficult to make the sizes of the distance between the diffusion layer constituting the FD 305 and the SF 308 or the size of the SF 308 the same between the pixel 205 having the first arrangement and the pixel 205 having the second arrangement, the magnitude of the noise superimposed on the phase difference signals will differ.

For example, if the number of pixels 205 having the first arrangement and the number of pixels 205 having the second arrangement arranged in the image sensor 1 are different, the wiring connecting the diffusion layer constituting the FD 305 and the SF 308 of the pixels 205 of the larger number is preferentially made shorter. Therefore, if the number of pixels 205 having the first arrangement is greater, the noise carried on the phase difference signal obtained from the pixels 205 having the second arrangement becomes larger. In other words, the S/N ratio of the phase difference signal is higher in the x direction than in the y direction.

Relationship between Noise in Phase Difference Signals, Electric Charge Crosstalk Rate, and Phase Difference Detection Performance As mentioned above, the smaller the conversion coefficient that converts an image shift amount to a defocus amount, the less susceptible to noise, and the smaller the electric charge crosstalk rate, the smaller the conversion coefficient can be.

Therefore, in this embodiment, the electric charge crosstalk rate of the pixels 205 having the second arrangement is made smaller than the electric charge crosstalk rate of the pixels 205 having the first arrangement. In this way, the phase difference signal in the y direction is relatively less susceptible to the influence of noise, thereby improving the phase difference focus detection performance, and roughly aligning it with the phase difference detection performance in the x direction.

In order to provide different electric charge crosstalk rates for the pixels 205 having the first arrangement and the pixels 205 having the second arrangement, an ion implantation process is performed such that, for example, p-type impurity concentrations in the separation areas 400 and 500 of the PDA 301 and the PDB 302 differ. Accordingly, it is possible to realize the image sensor 1 according to the present embodiment. In a case of the present embodiment, the impurity concentration of the separation areas 400 of the pixel 205 having the first arrangement is set lower, and the impurity concentration of the separation areas 500 of the pixels 205 having the second arrangement is set higher. That is to say, the magnitude relationship between the impurity concentration of the separation areas 400 of the pixels 205 having the first arrangement and the impurity concentration of the separation areas 500 of the pixels 205 having the second arrangement is set to be the same as the magnitude relationship between the influence of noise on the pixels 205 having the first arrangement and the second arrangement.

Such adjustment of electric charge crosstalk rates may be performed by setting the widths of separation areas of photoelectric conversion portions to be different from each other. In a case of the present embodiment, the width of the separation area 400 of the pixel 205 having the first arrangement is set smaller, and the width of the separation area 500 of the pixel 205 having the second arrangement is set larger. That is to say, the magnitude relationship between the width of the separation area 400 of the pixel having the first arrangement and the width of the separation area 500 of the pixel 205 having the second arrangement is set to be the same as the magnitude relationship between the influence of noise on the pixels 205 having the first arrangement and the second arrangement.

Furthermore, by setting a potential gradient for collecting an electric charge in a photoelectric conversion portion from the substrate back side to the substrate front side to be different between the pixel 205 having the first arrangement and the pixel 205 having the second arrangement, the electric charge crosstalk rate between the pixel 205 having the first arrangement and the pixel 205 having the second arrangement may be adjusted. In this case, the potential gradient of the pixel 205 having the first arrangement is set to be more moderate than the potential gradient of the pixel having the second arrangement, that is to say, the magnitude relationship of this steepness is set to be the same as the magnitude relationship between the influence of noise on the pixels 205 having the first arrangement and the second arrangement.

In addition, by combining impurity concentrations, widths of separation areas, and electrolytic gradients, which have been described above, adjustment may be made such that the electric charge crosstalk rate in the first direction is higher than the electric charge crosstalk rate in the second direction.

In addition, in the above example, a case has been described in which the electric charge crosstalk rate of the pixel 205 having the first arrangement and the electric charge crosstalk rate of the pixel 205 having the second arrangement are adjusted when the image sensor 1 is manufactured, but the present invention is not limited thereto, and a configuration may also be adopted in which adjustment can be made after the image sensor 1 has been manufactures. In that case, the electric charge crosstalk rates may be adjusted, for example, by disposing electrode portions in the separation areas 400 and 500 of the PDA 301 and the PDB 302 and controlling the potentials of the separation areas 400 and 500. In that case, the potential that is applied to the separation area 400 of the pixel 205 having the first arrangement is set lower than the potential that is applied to the separation area 500 of the pixel 205 having the second arrangement, that is to say, the magnitude relationship between the potentials is set to be the inverse to the magnitude relationship between the width H and the height V. Note that Deep Trench Isolation (DTI) coupled to control wirings can be used as the electrode portions.

In addition, a description has been given in which, in the above examples, all of the pixels 205 have the first arrangement or the second arrangement, but the present invention is not limited thereto, and some of the pixels 205 may be formed as pixels having the first arrangement or the second arrangement and placed in a discrete manner.

As described above, according to the first embodiment, in a case where on-imaging plane phase difference focus detection is performed using signals having different amounts of noise in the x and y directions obtained from an image sensor in which pixels are arranged in a matrix, it is possible to make the focus detection performance closer in the x and y directions.

Second Embodiment

Figure 14A:
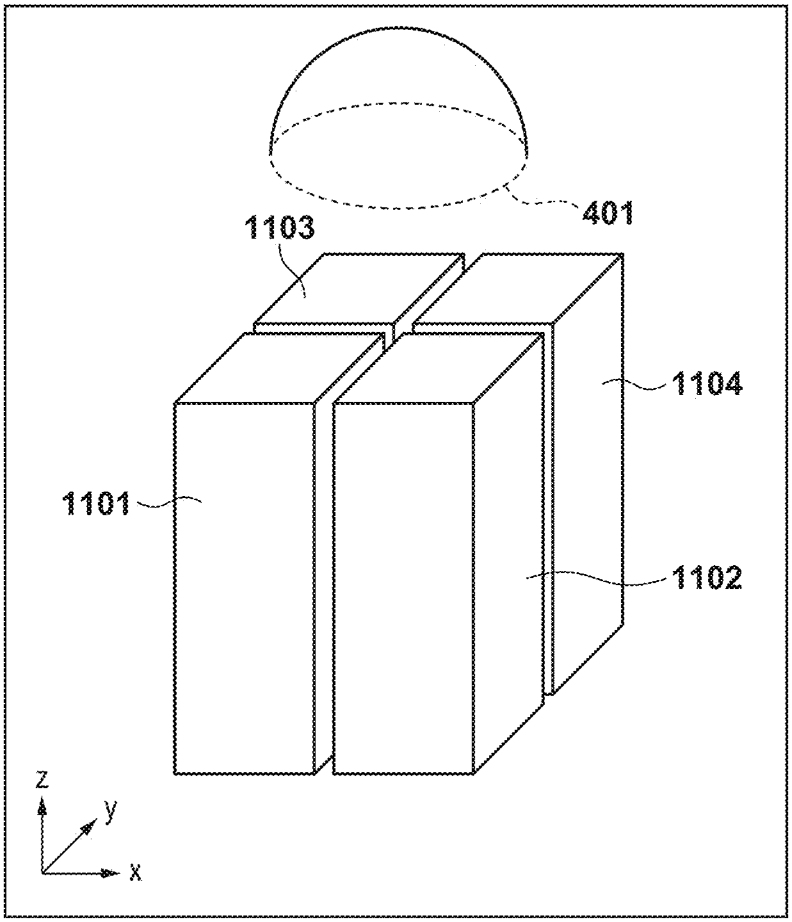
FIG. 14A is a schematic diagram showing a configuration of a pixel having third arrangement according to a second embodiment.
Figure 14B:
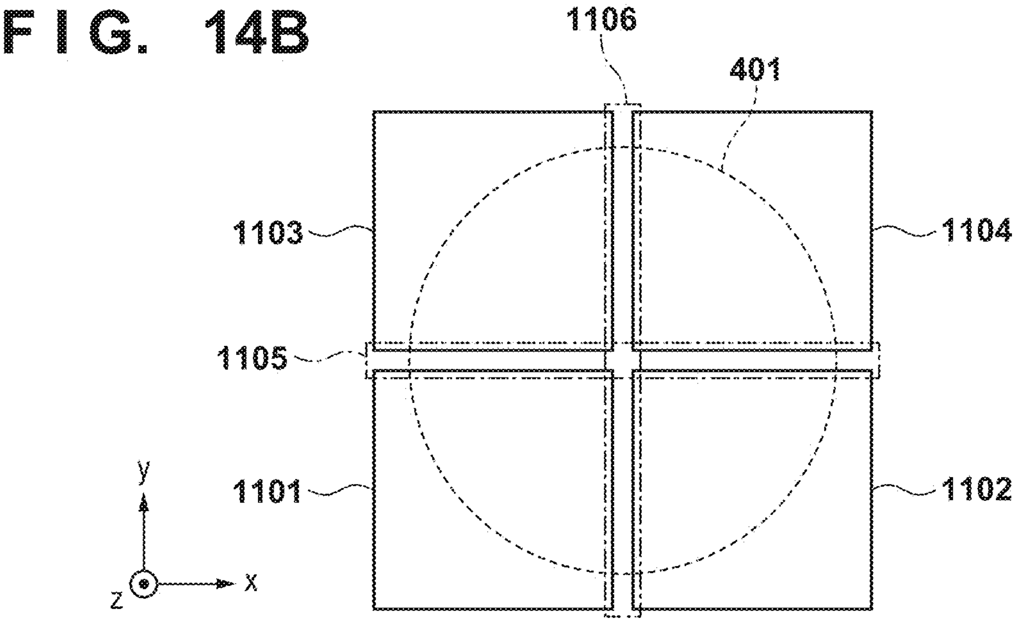
FIG. 14B is a schematic diagram showing the configuration of the pixel having the third arrangement according to the second embodiment.

Next, a second embodiment according to the present invention will be described. FIGS. 14A and 14B show a configuration of a pixel 205 having third arrangement of the image sensor 1 according to the present embodiment.

As shown in FIGS. 14A and 14B, in the third arrangement, the pixel 205 is constituted by four photo diodes (PDs) 1101 to 1104. Hereinafter, the four photo diodes are referred to as the PDA 1101, the PDB 1102, the PDC 1103, and the PDD 1104. FIG. 14A is a perspective view of the pixel according to the present embodiment, FIG. 14B is a schematic plane diagram showing a positional relationship in planar view as viewed from the ML 401 side (substrate back side), and, in the present embodiment, a transfer switch and the like are omitted. Note that definitions of “planar view” and x, y, and z are similar to those of FIGS. 4A and 4B, and thus a description thereof is omitted.

In the present embodiment, by defining the first direction as the x direction and the second direction as the y direction, phase-difference detection in two directions orthogonal to each other can be performed using pixels having the same configuration.

Phase-difference detection in the x direction can be performed by using the sum of signals of the PDA 1101 and the PDC 1103 (a signal A) and the sum of signals of the PDB 1102 and the PDD 1104 (a signal B), and phase-difference detection in the y direction can be performed by using the sum of signals of the PDA 1101 and the PDB 1102 (a signal C) and the sum of signals of the PDC 1103 and the PDD 1104 (a signal D). That is to say, also in the present embodiment, similarly to the first embodiment, the magnitude relationship between an electric charge crosstalk rate between photoelectric conversion portions corresponding to the signal A and the signal B and an electric charge crosstalk rate between photoelectric conversion portions corresponding to the signal C and the signal D matches the magnitude relationship between the influence of noise. Adjustment of electric charge crosstalk rates is performed based on impurity concentrations of a separation area 1105 and a separation area 1106, adjustment of widths, adjustment of potential gradients in photoelectric conversion portions, and potential control that uses electrodes, similarly to the first embodiment.

As described above, according to the second embodiment, even when each pixel includes a plurality of photoelectric conversion portions divided in two directions, it is possible to achieve effects similar to those of the first embodiment.

According to the present invention, it is possible to bring the focus detection performance in the row direction and the column direction closer to each other in a case where the S/N ratio of the focus detection signal obtained from an image sensor in which pixels are arranged in a matrix differs between the row direction and the column direction.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. An image sensor comprising:

a plurality of microlenses arranged in a matrix in a first direction and a second direction orthogonal to the first direction; and a plurality of photoelectric conversion portions provided for each microlens of at least some of the plurality of microlenses and configured to perform photoelectric conversion on light that has entered the photoelectric conversion portions via the each microlens, wherein the plurality of photoelectric conversion portions are arranged in at least one direction of the first direction and the second direction for the plurality of photoelectric conversion portions, wherein, in a case where influence of noise superimposed on signals read out from the plurality of photoelectric conversion units is greater in the second direction than in the first direction, the electric charge crosstalk rate between the plurality of photoelectric conversion units in the first direction is made higher than the electric charge crosstalk rate in the second direction, and wherein in the plurality of photoelectric conversion portions arranged in the first direction, a potential gradient from a side on which light is incident to an area in which an electric charge obtained through photoelectric conversion is accumulated is made more moderate than a potential gradient in the plurality of photoelectric conversion portions arranged in the second direction.

2. The image sensor according to claim 1, wherein the plurality of photoelectric conversion portions are two photoelectric conversion portions arranged in the first direction or the second direction.

3. The image sensor according to claim 1, wherein the plurality of photoelectric conversion portions are four photoelectric conversion portions arranged in the first direction and the second direction.

4. The image sensor according to claim 1, wherein impurity concentration of a separation area that separates the plurality of photoelectric conversion portions arranged in the first direction is set lower than impurity concentration of a separation area that separates the plurality of photoelectric conversion portions arranged in the second direction.

5. The image sensor according to claim 1, wherein a width of a separation area that separates the plurality of photoelectric conversion portions arranged in the first direction is set smaller than a width of a separation area that separates the plurality of photoelectric conversion portions arranged in the second direction.

6. The image sensor according to claim 1, further comprising an electrode for controlling a potential of a separation area that separates the plurality of photoelectric conversion portions, wherein a potential of a separation area that separates the plurality of photoelectric conversion portions arranged in the first direction is set lower than a potential of a separation area that separates the plurality of photoelectric conversion portions arranged in the second direction.

7. The image sensor according to claim 1, further comprising an output unit that converts the an electric charge obtained through photoelectric conversion by the plurality of photoelectric conversion portions into a signal and outputs the signal, wherein the output unit is implemented by one or more processors, circuitry or a combination thereof.

8. The image sensor according to claim 1, wherein a number of the plurality of photoelectric conversion portions arranged in the first direction is larger than a number of the plurality of photoelectric conversion portions arranged in the second direction.

9. An image sensor comprising:

a plurality of microlenses arranged in a matrix in a first direction and a second direction orthogonal to the first direction;

a plurality of photoelectric conversion portions provided for each microlens of at least some of the plurality of microlenses and configured to perform photoelectric conversion on light that has entered the photoelectric conversion portions via the each microlens;

a plurality of floating diffusion portions provided for the plurality of photoelectric conversion sections, respectively; and a charge-to-voltage conversion portion that converts charge transferred from the plurality of photoelectric conversion portions to the floating diffusion portions into voltages, wherein the plurality of photoelectric conversion portions are arranged in at least one direction of the first direction and the second direction for the plurality of photoelectric conversion portions, and wherein lengths of wirings from diffusion layers constituting the floating diffusion portions corresponding to the plurality of photoelectric conversion portions arranged in the first direction to the charge-to-voltage conversion portion is shorter than lengths of wirings from diffusion layers constituting the floating diffusion portions corresponding to the plurality of photoelectric conversion portions arranged in the second direction to the charge-to-voltage conversion portion, and the electric charge crosstalk rate between the plurality of photoelectric conversion units in the first direction is made higher than the electric charge crosstalk rate in the second direction.

10. An image capture apparatus comprising:

an image sensor comprising:

a plurality of microlenses arranged in a matrix in a first direction and a second direction orthogonal to the first direction; and a plurality of photoelectric conversion portions provided for each microlens of at least some of the plurality of microlenses and configured to perform photoelectric conversion on light that has entered the photoelectric conversion portions via the each microlens, and a processing unit that processes signals output from the image sensor, wherein the plurality of photoelectric conversion portions are arranged in at least one direction of the first direction and the second direction for the plurality of photoelectric conversion portions, wherein, in a case where influence of noise superimposed on signals read out from the plurality of photoelectric conversion units is greater in the second direction than in the first direction, the electric charge crosstalk rate between the plurality of photoelectric conversion units in the first direction is made higher than the electric charge crosstalk rate in the second direction, wherein in the plurality of photoelectric conversion portions arranged in the first direction, a potential gradient from a side on which light is incident to an area in which an electric charge obtained through photoelectric conversion is accumulated is made more moderate than a potential gradient in the plurality of photoelectric conversion portions arranged in the second direction, and wherein the processing unit is implemented by one or more processors, circuitry or a combination thereof.

11. The image capture apparatus according to claim 10, wherein the processing unit performs on-imaging plane phase difference focus detection based on the signals.

* * * * *